(12) United States Patent
Pisati et al.

(10) Patent No.: US 6,246,289 B1
(45) Date of Patent: Jun. 12, 2001

(54) VARIABLE-GAIN MULTISTAGE AMPLIFIER WITH BROAD BANDWIDTH AND REDUCED PHASE VARIATIONS

(75) Inventors: Valerio Pisati, Bosnasco; Salvatore Portaluri, Pavia; Alessandro Savo, Pavia; Stefano Marchese, Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/507,562

(22) Filed: Feb. 18, 2000

(30) Foreign Application Priority Data

Feb. 19, 1999 (IT) .............................. MI99A0350

(51) Int. Cl.$^7$ ....................................... H03F 3/45
(52) U.S. Cl. ............................. 330/254; 330/310
(58) Field of Search .................. 330/252, 254, 330/292, 310

(56) References Cited

U.S. PATENT DOCUMENTS

| 4,344,044 | * | 8/1982 | Harford ............................ | 330/254 |
| 5,057,788 | * | 10/1991 | Ushida et al. .................... | 330/261 |
| 5,461,342 | * | 10/1995 | Crabtree .......................... | 330/252 |
| 5,742,199 | | 4/1998 | Shoji et al. ...................... | 327/552 |
| 5,994,959 | * | 11/1999 | Ainsworth ........................ | 330/252 |

FOREIGN PATENT DOCUMENTS

| 59131210 | 7/1984 | (JP) . |
| 01032509 | 2/1989 | (JP) . |
| 02260906 | 10/1990 | (JP) . |
| WO 98/49769 | 11/1998 | (WO) . |

* cited by examiner

Primary Examiner—Benny Lee
Assistant Examiner—Henry Choe
(74) Attorney, Agent, or Firm—Theodore E. Galanthay; E. Russell Tarleton; Seed IP Law Group PLLC

(57) ABSTRACT

A programmable-gain multistage amplifier with broad bandwidth and reduced phase variations having a differential input stage biased by a first current source and to which a differential voltage signal is fed, the stage being connected to a pair of diodes in which the cathode terminals are connected to respective bipolar transistors, which are biased by a second current source and in which the collector terminals are connected to load resistors, the differential output of the amplifier being provided at the collector terminals of the bipolar transistors. The amplifier further includes two circuit branches, each of which is constituted by a bipolar transistor and by a third current source, which is respectively connected to the collector terminal and emitter terminal of the bipolar transistor, in which the base terminal receives the differential voltage signal and the collector terminal is connected to the cathode terminal of a respective one of the two diodes, the circuit branches being mutually connected by means of a pair of capacitors.

17 Claims, 3 Drawing Sheets

VARIABLE-GAIN MULTISTAGE AMPLIFIER WITH BROAD BANDWIDTH AND REDUCED PHASE VARIATIONS

TECHNICAL FIELD

The present invention relates to a variable-gain multistage amplifier with broad bandwidth and reduced phase variations. More particularly, the invention relates to a programmable-gain multistage amplifier suitable for providing variable-gain stages in which the control range has a wide programmability scale with linearity characteristics expressed in dBs.

BACKGROUND OF THE INVENTION

It is known that analog multiplier structures, such as for example the Gilbert multiplier, an embodiment of which is shown in FIG. 1, are used in the production of variable-gain stages.

This circuit is of the fully differential type and entails the application of a differential signal IN− and IN+ which is converted from a voltage to a current so that the current in output from the bridge of the Gilbert cell is constituted by a static component due to the current provided by the current source Io plus a signal component due to the differential input voltage IN− and IN+ divided by the resistance $R_E$.

The component of the current due to the differential input voltage is due to the transconductance of the input stage composed of the bipolar transistors 1 and 2 and specifically:

gm=gm/(1+gm/$R_E$)

where gm is the transconductance of transistors 1 and 2.

If now one assumes gm.$R_E$ to be much higher than 1, then gm is approximately equal to 1/$R_E$.

A variable control voltage Vc is applied between the base of a transistor 4 and the bases of transistors 3 and 5.

By solving mathematically the appropriate circuit equations, the gain of the circuit of FIG. 1 is found to be equal to:

G=$R_L$/$R_E$·[1/(1+$e^{Vc/Vt}$)]

where Vt is the threshold voltage of the transistors.

This expression can be used to show that when converting the gain into dBs by means of logarithms, in order to have gain linearity it is necessary to use a suitable control voltage Vc.

The maximum gain that can be obtained from the structure shown in FIG. 1 is in any case $R_L$/2/$R_E$ if the control voltage Vc is equal to 0.

This entails the fact that the upper limit of the gain has a maximum value beyond which it is impossible to go; said value can be obtained by decreasing the voltage Vc to 0, i.e., if the Gilbert multiplier is balanced.

Therefore, if one wishes to provide a high gain, the ratio between $R_L$ and $R_E$ must be given a high value, by increasing the value of the load resistor $R_L$ with respect to the resistor $R_E$. In practical terms, this entails the fact that a very large parasitic pole is generated which is determined by the product of the resistance $R_L$ and of the parasitic capacitor C, so that an increase in gain is inevitably associated with a reduction in the band, and this is a severe drawback.

Another known embodiment of a variable-gain amplifier is given in the prior documents JP 02260906A and JP 01032509A, which substantially discloses a circuit as shown in FIG. 2, in which only half of the differential circuit is shown.

Said figure illustrates a differential input stage to which a differential signal IN is fed; said differential input stage is connected to a diode (the complete differential circuit is obviously connected to a pair of diodes) Q3, whose cathode terminal is connected to the base terminal of a bipolar transistor Q4, in which the collector terminal is connected to the supply voltage by interposing a load resistor $R_L$ and the emitter terminal is connected to a current source I2.

The input signal IN is fed to a bipolar transistor Q1, whose collector terminal is connected to the cathode terminal of the diode Q3 and whose emitter terminal is connected to a resistor $R_E$, which is in turn connected to a current source 2$I_1$.

Parasitic capacitors $C_L$ are respectively connected between the collector terminal of the transistor Q4 and the resistor $R_L$ (parasitic capacitor $C_L$) and between the collector terminal of the transistor Q1 and the cathode of the diode Q3 (parasitic capacitor $C_p$).

The voltage gain can be obtained from this circuit configuration and is given by:

$$A_v = \frac{Vout}{Vin} = \frac{R_1}{R_E} \cdot \frac{I_2}{I_1}$$

which is obtained, as a first approximation, by ignoring the effect of the input transistor Q1.

Frequency response is instead given by the chart shown in FIG. 3, in which the first pole of the transfer function is equal to:

1/$R_L C_L$·2π while the second pole is determined mainly by the contribution of the parasitic capacitor $C_p$ to the node $V_1$, plus all the limitations determined by the transistors Q1, Q4 and Q3.

SUMMARY OF THE INVENTION

The present invention provides a programmable-gain multistage amplifier that has a broad bandwidth and reduced phase variations.

The present invention also provides a variable-gain amplifier that has a wide programmability range.

The present invention further provides a variable-gain amplifier that is highly reliable and relatively easy to manufacture at competitive costs.

The foregoing are achieved by a programmable-gain multistage amplifier with broad bandwidth and reduced phase variations, that includes a differential input stage biased by a first current source and to which a differential voltage signal is fed, the stage being connected to a pair of diodes in which the cathode terminals are connected to respective bipolar transistors, which are biased by a second current source, and in which the collector terminals are connected to load resistors, the differential output of the amplifier being provided at the collector terminals of the bipolar transistors; and further including two circuit branches, each of which is constituted by a bipolar transistor and by a third current source, which is respectively connected to the collector terminal and emitter terminal of the bipolar transistor, in which the base terminal receives the differential voltage signal and the collector terminal is connected to the cathode terminal of a respective one of the two diodes, the circuit branches being mutually connected by means of a pair of capacitors.

BRIEF DESCRIPTION OF THE DRAWINGS

Further characteristics and advantages of the invention will become apparent from the description of a preferred but not exclusive embodiment of the device according to the invention, illustrated only by way of non-limitative example in the accompanying drawings, wherein.

DETAILED DESCRIPTION OF THE INVENTION

Figure 1:
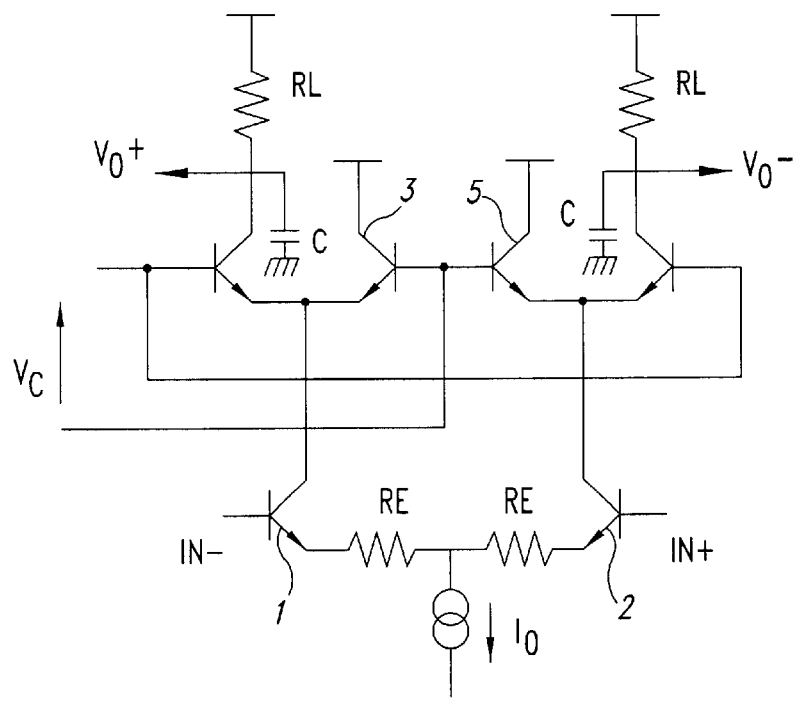
FIG 1 is a circuit diagram of a conventional variable-gain amplifier (Gilbert bridge)
Figure 2:
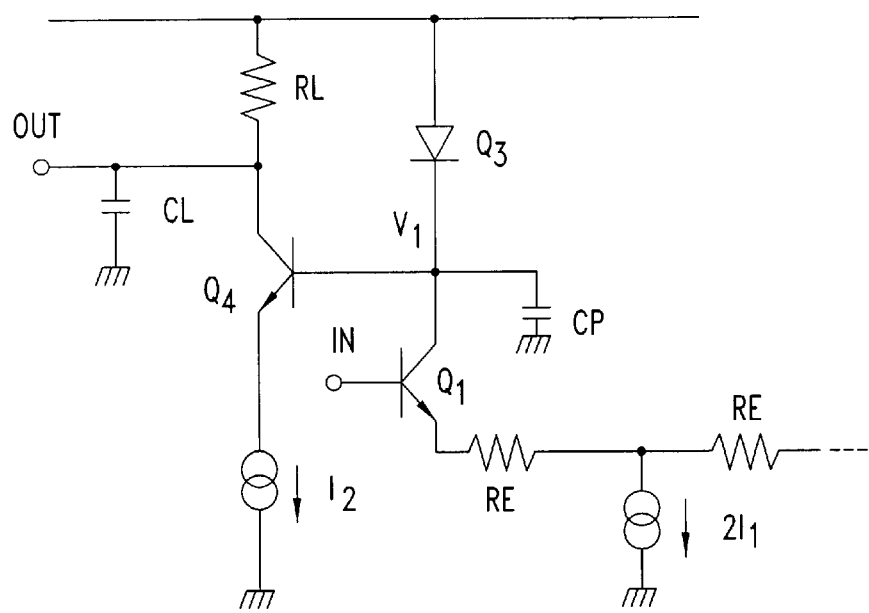
FIG. 2 is a circuit diagram of a second embodiment of a conventional variable-gain amplifier.
Figure 3:
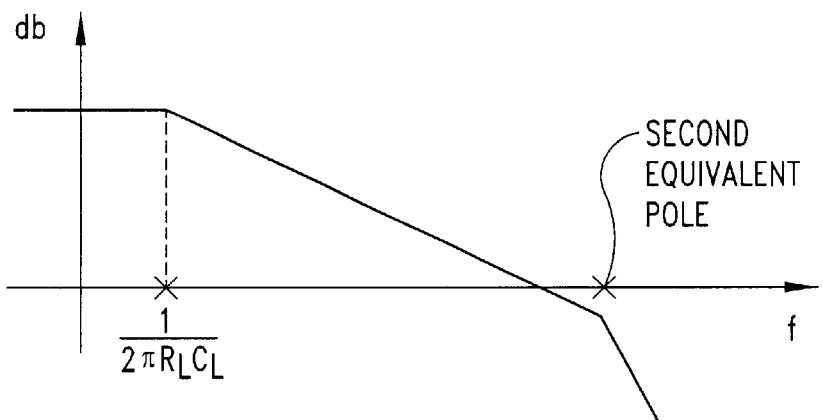
FIG. 3 is a Bode diagram of the frequency response of the amplifier of FIG. 2.

In the various figures, identical elements are designated by the same reference numerals.

Figure 4:
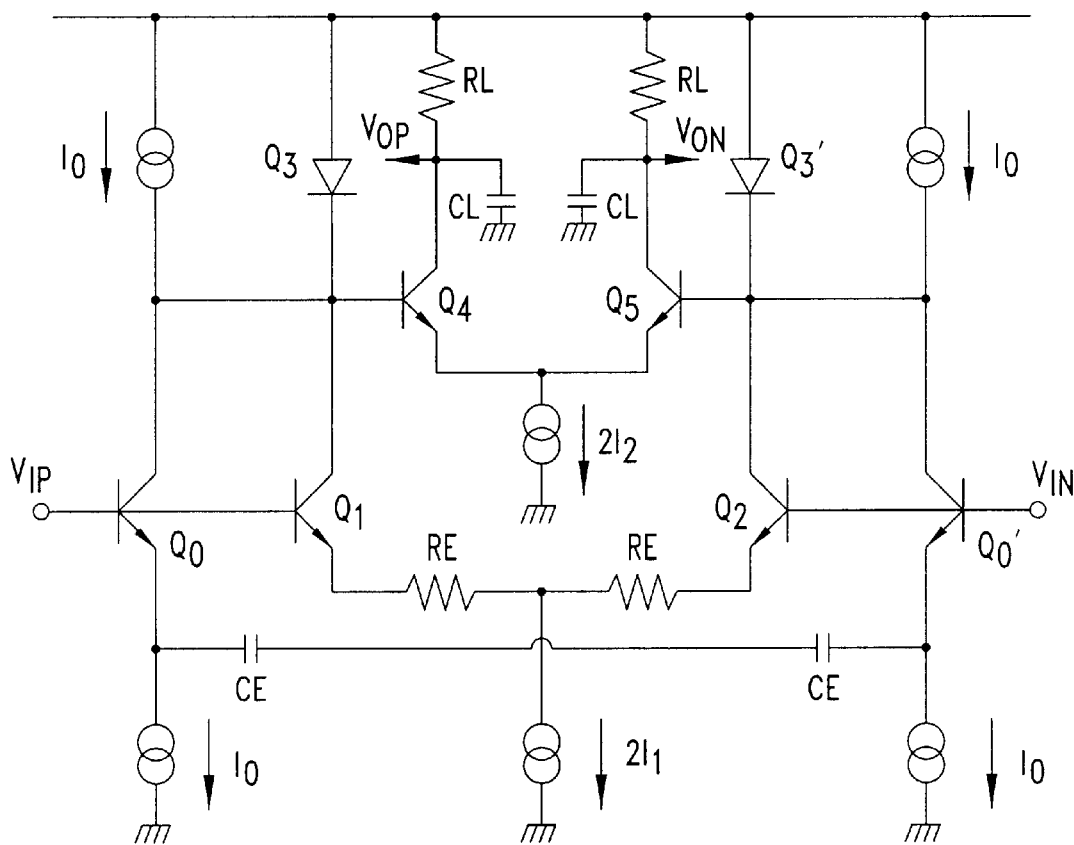
FIG. 4 is a circuit diagram of a multistage amplifier according to the present invention.
Figure 5:
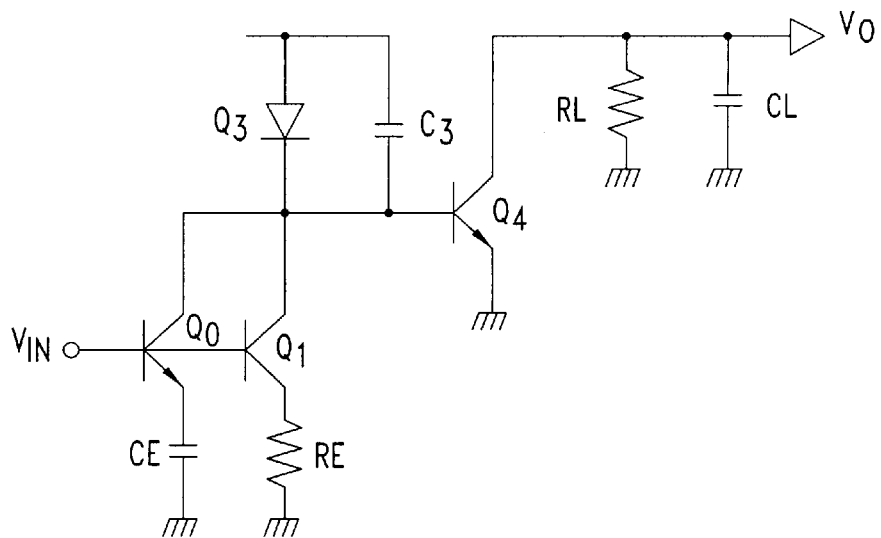
FIG. 5 is a circuit diagram for small signals, derived from the circuit diagram of FIG. 4.
Figure 6:
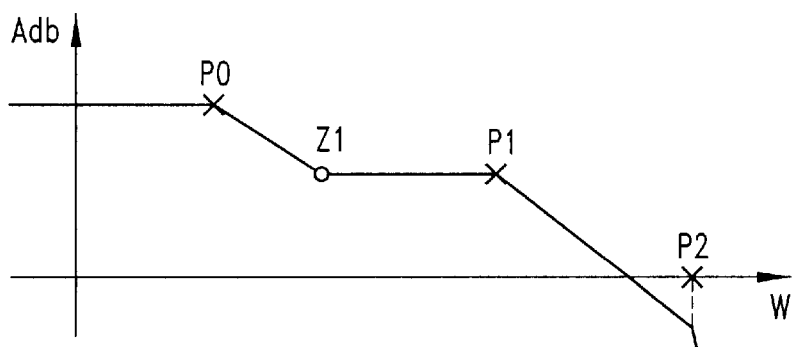
FIGS. 6 and 7 are Bode diagrams of the amplifier of FIG. 4.

Accordingly with reference to FIGS. 4 to 6, the multistage amplifier according to the present invention comprises two input bipolar transistors Q1 and Q2, which constitute a differential input stage whose base terminals receive a differential input signal Vin and Vip. The input stage is biased by a first current source $2I_1$, by means of a pair of resistors $R_E$.

The collector terminals of the transistors Q1 and Q2 are respectively connected to the cathode terminals of two diodes Q3 and Q3', whose anode terminals are connected to the supply voltage.

Two other bipolar transistors Q4 and Q5 are connected, by means of their base terminals, to the respective cathode terminals of the diodes Q3 and Q3', have common-connected emitter terminals and collector terminals that are connected to the supply voltage by means of resistors $R_L$.

The bipolar transistors Q4 and Q5 are biased by a second current source $2I_2$ which is suitable to feed current to the respective emitter terminals of the transistors Q4 and Q5.

The disclosed embodiment of the invention has two further circuit branches, each of which is constituted by a bipolar transistor Q0 and Q0' and by a third current source $I_0$ respectively connected to the collector terminal and emitter terminal of the bipolar transistors Q0 and Q0'. The differential voltage signal is fed to the base terminal of the transistors, and their collector terminals are connected to the cathode terminal of the corresponding diode Q3 of the pair of diodes Q3 and Q3'.

The circuit branches are mutually connected by means of a pair of capacitors $C_E$.

Parasitic capacitors $C_L$ are respectively present at the collector terminals of the transistors Q4 and Q5.

Assuming now that the effect of the parasitic capacitors $C_L$ at the nodes V1 is negligible, and that the effect of the transistors Q0, Q0', and Q1 is also negligible, the transfer function is as follows:

$$\frac{Vo}{Vin}(S) = \frac{gm2}{gm3} \cdot R_L \cdot \frac{gm1}{1+gm1R_E} \cdot \frac{1+SC_E(1+gm1R_E)/gm1}{1+SR_LC_L}$$

where gm0, gm1, gm2 and gm3 are the transconductances of the corresponding bipolar transistors Q0, Q1, Q2 and Q3.

$$H(S) = \frac{Vo}{Vin}(S) = \frac{gm4}{gm3} \cdot \frac{R_L}{R_E} \cdot \frac{1+SC_ER_E}{1+SR_LC_L} = \frac{R_L}{R_E} \cdot \frac{I_2}{I_1} \cdot \frac{1+SC_ER_E}{1+SR_LC_L}$$

A negative real zero (in addition to a pole) has thus been introduced at the frequency:

$$\frac{1}{2\pi R_E C_E}$$

Accurate calculations determine the dependency of the zero on the current $I_0$ and therefore the frequency programmability of the zero introduced by means of the two additional circuit branches.

Considering in this regard the circuit for small signals of FIG. 5, one obtains:

$$H(S) = \frac{Vo(S)}{Vin}$$

$$= \frac{gm1gm4R_L}{gm3(1+gm1R_E)} \cdot \frac{1+SC_E}{(1+SR_LC_L)} \cdot \frac{\frac{gm1+gm\phi+gm1gm\phi R_E}{gm1gm\phi}}{\left(1+S\frac{C_E)}{gm\phi}\right) \cdot \left(1+S\frac{C3}{gm3}\right)}$$

The poles and the zero are as follows:

$$Z_1 = \frac{gm\phi}{C_E} \cdot \frac{gm1}{gm\phi+gm1+gm\phi gm1R_E}$$

$$P_1 = \frac{gm\phi}{C_E}$$

$$P_\phi = \frac{1}{R_LC_L}$$

$$P_2 = \frac{gm3}{C_3}$$

where, if the term $\frac{gm1}{gm\phi+gm1+gm\phi gm1R_E}$ is represented by $\alpha$ $$Z_1 + \alpha P_1 = P_1 \cdot \frac{gm1}{gm\phi+gm1+gm\phi gm1R_E}$$

$$= P_1 \cdot \frac{1}{1+gm\phi\frac{(1+gm1R_E)}{gm1}}$$

Figure 7:
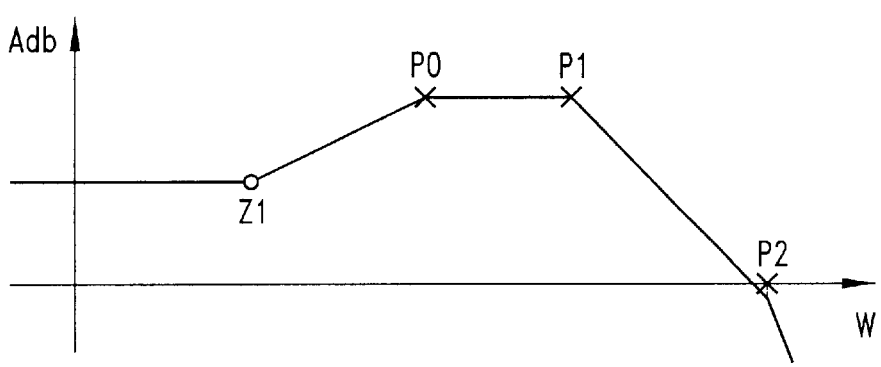

Depending on the values of the current $I_0$, it is possible to have two different conditions in the corresponding Bode diagrams of the amplitude, which are shown in FIGS. 6 and 7.

Likewise, the presence of the zero and of the pole added by introducing the pair of above-described circuit branches also affects the Bode diagrams of the phase.

In practice it has been observed that the variable-gain amplifier according to the invention fully achieves the intended aim and objects, since it achieves a dB-linear gain the value of which is determined exclusively by one or more currents that can vary at will, maintaining a broad bandwidth, since it is not necessary to act on the load resistors $R_L$ in order to increase the gain.

The variable-gain amplifier thus conceived is susceptible of numerous modifications and variations, all of which are within the scope of the invention.

Finally, all the details may be replaced with other technically equivalent elements.

The disclosures in Italian patent application no. M199A000350, whose priority is claimed in the present application, are included herein by reference.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs. Thus, the invention is to be limited only by the scope of the claims that follow and the equivalents thereof.

What is claimed is:

1. A variable-gain multistage amplifier with broad bandwidth and reduced phase variations, comprising a differential input stage biased by a first current source and to which a differential voltage signal is fed, said differential input stage connected to a pair of diodes in which the cathode terminals are connected to respective first and second bipolar transistors that are biased by a second current source and in which collector terminals of said first and second bipolar transistors are connected to load resistors, a differential output of said amplifier being provided at the collector terminals of said first and second bipolar transistors, and further comprising two circuit branches, each of which is constituted by a branch bipolar transistor and by a third current source, the third current source respectively connected to a collector terminal and an emitter terminal of said branch bipolar transistors, and in which base terminals of the branch bipolar transistors receive said differential voltage signal and the collector terminal of each bipolar transistor is connected to the cathode terminal of a respective one of said two diodes, said two circuit branches having emitter terminals connected by means of a pair of capacitors.

2. The variable-gain amplifier of claim 1 wherein said second current source is connected to the emitter terminals of said first and second bipolar transistors.

3. The variable-gain amplifier of claim 1 wherein the emitter terminals of said first and second bipolar transistors are connected to each other.

4. The variable-gain amplifier of claim 1 wherein said differential input stage comprises two bipolar transistors, resistors being connected to the respective emitter terminals of said two bipolar transistors, said current source connected to the differential stage further connected to a node for mutually connecting said resistors of the differential input stage.

5. The variable-gain amplifier of claim 4 wherein said differential voltage signal is fed to the base terminals of said two bipolar transistors of the differential input stage.

6. An amplifier, comprising:
a first differential pair of transistors, each transistor having an emitter coupled to a first current source, a collector coupled to a common voltage source through a respective diode, and a base forming a differential input;
a second differential pair of transistors, each transistor having an emitter coupled to a second current source, a collector coupled to a resistive element to form an output node, the resistive element coupled in series to the voltage source, and a base coupled to a third current source; and
a third differential pair of transistors, each transistor having an emitter coupled to the third current source, a collector coupled to the third current source, and a base coupled to the respective base of the first differential pair of transistors the emitters connected by means of a pair of capacitive elements.

7. The amplifier of claim 6 wherein the diode comprises a cathode terminal coupled to the respective collector of the first differential pair of transistors.

8. The amplifier of claim 7 wherein the emitters of the first pair of differential transistors are coupled together through a resistive element.

9. The amplifier of claim 6, further comprising a parasitic capacitance between each output node and a common reference node.

10. The amplifier of claim 6 wherein the first, second, and third pair of differential transistors are configured to generate an output having three poles.

11. The amplifier of claim 10 wherein the first, second, and third pair of transistors are further configured to generate an output that further comprises a single zero.

12. The amplifier of claim 10, further comprising a differential voltage signal fed to the base terminals of the first differential pair of transistors.

13. A variable-gain amplifier, comprising:
a first differential stage having first and second inputs for receiving a differential input voltage, the differential input stage coupled to a first current source;
a second differential stage coupled to a second current source and having first and second outputs for outputting an amplified differential output signal; and
first and second circuit branches comprising first and second bipolar transistors having collector and emitter terminals coupled to a third current source, the collector terminals further coupled to respective control terminals of the second differential stage, and further comprising base terminals coupled to the respective inputs of the first differential stage, the emitter terminals connected by means of a pair of capacitive elements.

14. The amplifier of claim 13, further comprising diodes coupled between a voltage supply and the control terminals of the second differential stage.

15. The amplifier of claim 14 wherein the first differential stage comprises first and second input transistors having collector terminals coupled to the respective control terminals of the second differential stage.

16. The amplifier of claim 15 wherein the first and second differential stages and the first and second circuit branches are configured to generate a differential output signal having three poles.

17. The amplifier of claim 16 wherein the first and second differential stages and the first and second circuit branches are further configured to generate a differential output signal having a single zero.

* * * * *

UNITED STATES PATENT AND TRADEMARK OFFICE
CERTIFICATE OF CORRECTION

PATENT NO.    : 6,246,289 B1
DATED         : June 12, 2001
INVENTOR(S)   : Valerio Pisati et al.

It is certified that error appears in the above-identified patent and that said Letters Patent is hereby corrected as shown below:

<u>Title page,</u>
Item [30], the foreign priority application number should read -- MI99A000350 --.

Signed and Sealed this

Fifth Day of August, 2003

JAMES E. ROGAN
*Director of the United States Patent and Trademark Office*